Oct. 25, 1960 E. M. PELL 2,958,022

ASYMMETRICALLY CONDUCTIVE DEVICE

Filed May 15, 1958

Inventor:
Erik M. Pell,
by John F. Ahern
His Attorney.

United States Patent Office 2,958,022 Patented Oct. 25, 1960

2,958,022

ASYMMETRICALLY CONDUCTIVE DEVICE

Erik M. Pell, Scotia, N.Y., assignor to General Electric Company, a corporation of New York Filed May 15, 1958, Ser. No. 735,402

5 Claims. (Cl. 317—235)

Figure 1:
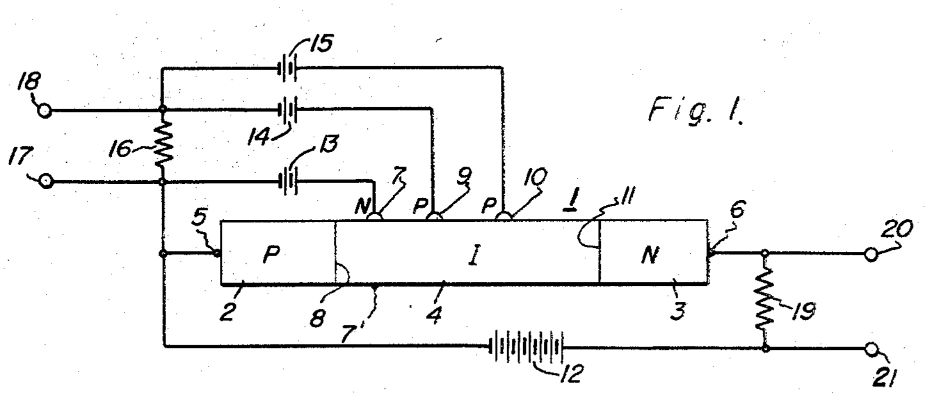

The present invention relates to improved semiconductor asymmetrically conductive devices. More particularly, the invention relates to improvements in devices generally denominated as spacistors.

A junction transistor, the most common semiconductor signal translating device, comprises a pair of one-conductivity regions separted by a thin region of opposite-conductivity type bounded by two closely spaced P–N junctions. Minority charge carriers are injected in the central, or base, region from one opposite-conductivity type region, denominated the emitter. The flow of current in the emitter circuit, a low impedance circuit, determines the flow of current in the output, or collector circuit. Since the collector circuit is a high impedance circuit, voltage and power amplification may be obtained. One disadvantage of the transistor is that it is a low input impedance device.

The spacistor, on the other hand, utilizes only one P–N junction separating one and opposite-conductivity regions. A source contact is made to the one-conductivity region and a drain electrode is connected to the opposite-conductivity type region. The P–N junction is biased in the reverse direction to cause the establishment of a wide space charge region. A space charge region exists at all P–N junctions and is characterized by substantial absence of either positive or negative conduction carriers. In the spacistor, the reverse bias applied to the space charge region greatly widens the space charge region.

Two contacts are made to the widened space charge region to complete the spacistor. An injector electrode and a modulator electrode are made to the space charge region in close proximity to the one-conductivity region of the device. The injector electrode is biased to inject carriers of opposite-conductivity type and a modulator electrode is biased to repel the injected carriers, which are collected by the drain electrode. An input signal is applied between source and modulator electrodes, and an output signal is taken across a load in the source-drain external circuit. The device operates upon the mechanism of modulation of the current flowing in the injector-drain circuit by signals applied to the modulator electrode. Advantages of the spacistor include its high input impedance and improved high frequency characteristics.

A great disadvantage, one which has heretofore prevented commercial manufacture of spacistors, is the difficulty of making two contacts to the space charge region of a semiconductor P–N junction device which region is extremely thin, of the order of 0.005 inch. Another disadvantage of the spacistor is that input and output circuits are closely capacitively coupled, requiring external neutralizing circuits at high frequencies.

Accordingly, it is an object of the present invention to provide improved spacistor devices suitable for commercial production.

It is a further object of the present invention to provide spacistor devices with low input-output coupling.

Briefly stated, in accord with one feature of the present invention, I provide a spacistor structure including a one-conductivity type region and an opposite-conductivity type region separated by a wide intrinsic region. Injector and modulator contacts are readily made to the intrinsic region. In accord with another feature of the invention, input-output coupling is reduced by the addition of an isolation electrode to the intrinsic region located between injector and modulator electrodes, on one hand, and the drain electrode on the other hand.

Figure 3:
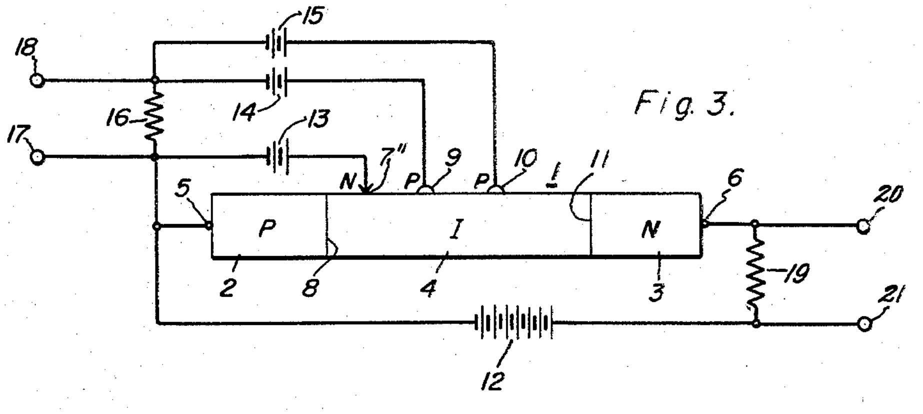
Figure 2:
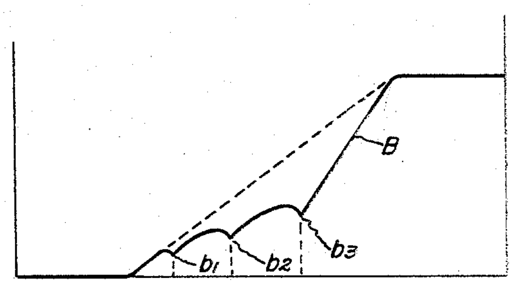

The novel features believed characteristic of the present invention are set forth in the appended claims. The invention itself, together with further objects and advantages thereof, may best be understood with reference to the following description taken in connection with the attached drawing in which:

Fig. 1 is a schematic representation of a spacistor constructed in accord with one feature of the present invention, Fig. 2 is a graphical representation of the voltage levels within the device of Fig. 1, and Fig. 3 is an alternative embodiment of the device of Fig. 1.

Fig. 1 of the drawing illustrates in schematic form a spacistor device, together with its associated operating circuit, constructed in accord with the present invention. The device of Fig. 1 includes a semiconductor body 1 including a P-type region 2 and an N-type region 3 separated by a wide intrinsic region 4. A source electrode 5 is made to P-type region 2, and a drain electrode connection 6 is made to N-type region 3. An injector electrode 7 which, in this instance, constitutes a donor alloyed contact, is made to the intrinsic region 4 relatively close to P–I junction 8 separating regions 2 and 4 respectively. A modulator electrode connection 9 comprising an acceptor alloyed contact is also made to intrinsic region 4 relatively close to the P–I junction 8. A buffer electrode 10, also comprising an acceptor activator alloyed contact, is connected with intrinsic region 4 between injector electrode 7 and modulator electrode 9 on the one hand and N-type region 3 on the other hand. What constitutes donor and acceptor activators for semiconductor bodies is well known to the art, thus, for example, the elements of group III of the periodic table are acceptors and the materials of group V of the periodic table are donors for germanium, silicon, and silicon carbide, while elements of groups II and VI are acceptors and donors respectively for group III to V inter-metallic compounds.

As illustrated, the P–I–N junction within the device is biased in the reverse direction so that there is substantially no current flow from the source to the drain electrodes. Injector electrode 7 is biased positively with respect to source electrode 5. Modulator electrode 9 and buffer electrode 10 are individually biased positively with respect to source electrode 5. The actual biases applied to the respective electrodes are not, however, completely representable by the biases applied thereto, since the important characteristic of the bias applied to a particular electrode is not the potential with respect to the source or drain elecrode, but the potential of the particular electrode with respect to the semiconductor material with which it is in contact at that particular point. Since the device operates upon a mechanism of injection of carriers (in the instance illustrated in Fig. 1 by the injection of electrons) from injector electrode 7 and the collection of these electrodes by drain electrode 6, it is necessary that the injector electrode 7 be biased in the forward direction with respect to the semiconductor material with which it is in contact and that modulator electrodes 9 and buffer electrodes 10 be biased in the reverse direction with respect to the semiconductor material with which they are in contact.

The precise relationship of the potentials applied to electrodes 7, 9, and 10 may more readily be understood by reference to Fig. 2 of the drawing. Fig. 2 is a graphical representation of the voltage gradient through semiconductor device 1 of Fig. 1. As may be seen from Fig. 2, the potential through P-type region 2 is at substantially the reference potential until P–I junction 8 is encountered. At that time, an increase in potential is evident and, were it not for the bias applied to electrodes 7, 9, and 10, there would arise a linear and gradual rise in potential represented by dotted line curve A through intrinsic region 4 until P–I junction 11 was encountered at which time the full applied voltage would be reached. The actual potential through region 4 with potentials applied to electrodes is represented by curve B of Fig. 2. From curve B, it may be seen that at position $b_1$, a positive bias applied to the injector electrode which is somewhat lower than the potential of the semiconductor region with which it is in contact causes the potential at that point to fall at point $b_1$. Since injector contact 7 is a donor contact, and it is negative with respect to the semiconductor material with which it is in contact, the junction formed thereby is biased in the forward direction, facilitating the injection of electrons into intrinsic region 4.

Referring again to curve B, it may be seen that as one progresses inwardly of the crystal farther away from P-type region 2 from point $b_1$, the potential of the intrinsic region rises but does not again reach the potential indicated by dotted line curve A which would be attained in the absence of biases applied to contacts 7, 9, and 10. The potential within the semiconductor continues to rise until point $b_2$ is reached at which modulator contact 9 is located. Modulator contact 9, like injector contact 7, is biased positively with respect to P-type region 2 and source electrode 5 but is positive only to a value chosen so that the modulator contact 9 is negative with respect to the semiconductor material with which it is in contact. This causes the potential of that material to be lowered slightly as by the dip indicated at $b_2$. Since modulator contact 9 is an acceptor contact, the fact that it is at a negative potential with respect to the semiconductor material with which it is in contact, causes it to be biased in the reverse direction. This prevents modulator contact 5 from drawing electron current, namely the electrons injected into intrinsic region 4 from injector contact 7.

As one passes a further distance into intrinsic region 4 away from P-type region 2 past point $b_2$, the potential of the intrinsic region gradually rises but once again, fails to rise to the level which would exist within the intrinsic region were it not for the biases applied to electrodes 7, 9, and 10. This condition exists until point $b_3$ is reached at which buffer electrode 10 is located. As may be seen from Fig. 1 of the drawing, isolation electrode 10 is biased with a positive potential with respect to source electrode 5. This voltage is, however, chosen to be substantially below the potential of the semiconductor material with which it is in contact, so that it is, in effect, negative with respect to the material it contacts causing the potential immediately thereabout to fall to a minimum value indicated at $b_3$. Because of the fact that isolation electrode 10 is an acceptor contact and is negative with respect to the semiconductor material it contacts, the junction between contact 10 and intrinsic region 4 is biased in the reverse direction. As with respect to electrode 9, this condition is necessary in order to prevent the electrode from drawing electron current and depreciating from the stream of electrons injected at injector electrode 7 and collected by source region 3. With respect to both of these biases, it should be mentioned that the relative values of the bias applied, and the potential of the semiconductor material with which electrons are in contact, are so chosen so that the positive swing of the electrodes with respect to the semiconductor material with the application of transient signals is insufficient to cause the electrodes to swing positive with respect to semiconductor material and thus cause electrons to be attracted thereto.

As one progresses inwardly within intrinsic region 4 away from P-type region 2, the potential of the semiconductor body, as illustrated by curve B rises to the maximum applied value which is encountered at I–N junction 11 and which is maintained substantially constant throughout N-type region 3.

As an example of a particular device as described hereinbefore, and suitable bias voltages to satisfy the foregoing criteria, semiconductor body 1 may be a monocrystalline ingot of silicon approximately 1/8 inch long and wide intrinsic region 4 may be approximately 0.05 inch thick. P-type region 2 may be impregnated with $10^{18}$ atoms per sq. cm. thereof of boron and exhibit a resistivity of 0.02 ohm centimeter. N-type region 3 may be impregnated with approximately $10^{18}$ atoms per sq. cm. thereof of lithium and exhibit a resistivity of 0.02 ohm centimeter. A reverse bias of 100 volts is applied between source electrode 5 and drain electrode 6 by means of a unidirectional voltage source represented by battery 12. Substantially all of this voltage is impressed across intrinsic region 4, the electrical potential of which varies from the reference potential of P-type region 2 and P–I junction 8 to the maximum positive potential of N-type region 3 at I–N junction 11. Injector electrode 7 is located 0.005 inch away from P–I junction 8, modulator electrode 10 is located approximately 0.010 inch away from injector electrode 7 along the length of intrinsic region 4 and isolation electrode 10 is located approximately 0.025 inch away from modulator electrode 9 along the length of intrinsic region 4.

Although injector, modulator and source electrodes are represented as being in a row between source and drain, this geometry is not necessary. It is only necessary that modulator electrode 9 be in a position to influence the flow of carriers from injector to drain. It could, for example, be located at point 7′ across from electrode 7. Isolation electrode 10 need only be located at a point where a potential applied thereto is capable of preventing internal feed back from output circuit to input circuit.

In order that the electrical biases be maintained as described above, a positive potential of 9.9 volts is applied to injector electrode 7 by a suitable source represented by battery 13. In order that modulator electrode 9 have a suitable potential applied thereto with respect to intrinsic region 4, with which it is in contact as described hereinbefore, a positive potential of 15 volts is applied thereto by means of a voltage source represented by battery 14 connected in circuit between modulator electrode 9 and source electrode 5. A bias potential of 30 volts is applied to buffer electrode 10 by means of battery 15. Suitable electrical input signals are applied across input resistance 16 at terminals 17 and 18 which impresses modulating voltage between modulating electrode 9 and source electrode 5. An output voltage is taken from the circuit across output resistance 19 by terminals 20 and 21 which are connected between drain electrode 3 and source electrode 5.

In accord with my present invention, it is essential that intrinsic region 4 be made much wider than have space charge regions in spacistor devices heretofore. In order that such a wide intrinsic region may be formed, the technique disclosed and claimed in my copending application, Serial No. 735,411, filed concurrently herewith and assigned to the present assignee, may be utilized. Briefly stated, in accord with this method, a P–N junction is formed in a body of semiconductor material utilizing a rapidly-diffusing, highly-mobile activator impurity for the semiconductor as the activator upon one side of the P–N junction. The P–N junction so formed is then biased in the reverse direction so as to impress an electric field of approximately $10^5$ volts per centimeter across the junction. The device is then heated to a temperature sufficient to cause the highly-mobile activator ions on one side of the junction to migrate, under the impetus of the electric field, across the junction to cause the formation of a very wide intrinsic region. Highly mobile ions suitable for this process include lithium in silicon, or silicon carbide, and the conventional donor and acceptor activator impurities as set forth in my aforementioned copending application, for high temperature semiconductors such as silicon carbide, boron, groups III–V intermetallic compounds, such as aluminum phosphide, gallium arsenide, and indium antimonide, as well as the conventional donor and acceptor activators for groups II–VI intermetallic compounds, such as zinc telluride and cadmium telluride.

As mentioned hereinbefore, it is essential for the operation of my device that a wide intrinsic region be incorporated within the semiconductor body. As used herein, the term "wide intrinsic region" is meant to connote an intrinsic region having a thickness greater than that achievable in any given semiconductor, having a given resistivity and purity, by the establishment of a space charge region therein at an associated P–N junction. Preferably, however, for optimum device operation and facile fabrication, this width should be at least 0.02 inch wide.

Fig. 3 of the drawing illustrates an alternative embodiment of the device illustrated in Fig. 1. In Fig. 3, all parts are identical with, and are identified by the same reference numerals as in the device and circuit of Fig. 1. The sole difference is that injector electrode 7, rather than being an N-type donor contact to the intrinsic region is a point contact as, for example, a platinum, platinum-ruthenium, or tungsten point such as those utilized in point contact transistors and diodes. Since the sole function of electrode 7 is to inject carriers into the body of the device and since such points are well known to be capable of injecting electrons or holes into an intrinsic region, this substitution may readily be made.

While in the devices of Figs. 1 and 3, it has been represented that source 2 comprises P-type material and drain 3 comprises N-type material, with the injection of electrons being made near the source, this configuration may be reversed as two types without any significant difference in the mode of operation thereof. Thus, for example, in Fig. 1, source region 2 may constitute N-type semiconductor material and drain region 3 may constitute P-type semiconductor material. In this instance, injector electrode 7 would be an acceptor or point contact, modulator electrode 9 would be a donor contact, and buffer electrode 10 would be a donor contact. In this instance, the device would operate upon the mechanism of injection of positive holes from P-type injector electrode 7 which holes would then migrate to P-type drain 3. If such substitution would be made, of course, in order that the device be biased in the reverse direction, the polarities of batteries 12, 13, 14, and 15 would be reversed, but the relative magnitudes would be the same.

While the invention has been set forth hereinbefore with respect to certain embodiments thereof, many modifications and changes will readily occur to those skilled in the art. Accordingly, by the appended claims, I intend to cover all such modifications and changes as fall within the true spirit and scope of the invention.

What I claim as new and desire to secure by Letters Patent of the United States is:

1. An asymmetrically conductive device comprising; a monocrystalline body of semiconductor material having a first region of one-conductivity type, a second region of opposite-conductivity type, and a third region of intrinsic conductivity type intermediate said first and said second regions; an injector electrode and a modulator electrode contacting said intrinsic regions in the vicinity of said one-conductivity type region; and a buffer electrode contacting said intrinsic region intermediate said injector modulator electrodes on the one hand, and said opposite-conductivity type region on the other hand.

2. An asymmetrically conductive device comprising; a monocrystalline body of semiconductor material having a first region of one-conductivity type, a second region of opposite-conductivity type, and a third region of intrinsic conductivity type intermediate said first and said second regions; an injector electrode comprising a source of opposite-conductivity type conduction carriers and a modulator electrode comprising a one-conductivity type activator contact both in contact with said intrinsic region in the vicinity of said one-conductivity type region; and a buffer electrode comprising a one-conductivity type activator contact in contact with said intrinsic region intermediate said injector and said modulator electrodes on the one hand, and said opposite-conductivity type region on the other hand.

3. An asymmetrically conductive device comprising; a monocrystalline body of semiconductor material having a first region of one-conductivity type, a second region of opposite-conductivity type, and a third region of intrinsic conductivity type intermediate said first and said second regions; an injector electrode comprising an opposite-conductivity type inducing activator contact and a modulator electrode comprising a one-conductivity type inducing activator contact in contact with said intrinsic region in the vicinity of said one-conductivity type region; and a buffer electrode comprising a one-conductivity type activator contact in contact with said intrinsic region intermediate said injector and said modulator electrodes on the one hand, and said opposite-conductivity region on the other hand.

4. An asymmetrically conductive device comprising; a monocrystalline body of semiconductor material having a first region of positive conductivity type, a second region of negative conductivity type, and a third region of intrinsic conductivity type intermediate said first and said second regions; an electron injector electrode and a modulator electrode, said modulator electrode comprising an acceptor contact, both in contact with said intrinsic region in the vicinity of said one-conductivity type region; and a buffer electrode comprising an acceptor activator contact, contacting said region intermediate said injector and said modulator electrodes on the one hand, and said negative conductivity type region on the other hand.

5. An asymmetrically conductive device comprising; a monocrystalline body of semiconductor material having a first region of negative conductivity type, a second region of positive conductivity type, and a third region of intrinsic conductivity type intermediate said first and said second regions; a positive hole injector electrode and a modulator electrode, said modulator electrode comprising a donor activator contact, both in contact with said intrinsic region in the vicinity of said negative conductivity type region; and a buffer electrode comprising a donor activator contact in contact with said intrinsic region intermediate said injector and said modulator electrodes on the one hand, and said positive conductivity type region on the other hand.

References Cited in the file of this patent

FOREIGN PATENTS 1,025,994 Germany ------------- Mar. 13, 1958